US012677444B2

(12) United States Patent
Lee et al.

(10) Patent No.: US 12,677,444 B2
(45) Date of Patent: Jul. 7, 2026

(54) SEMICONDUCTOR DEVICE INCLUDING AMORPHOUS OXIDE SEMICONDUCTOR CHANNEL LAYER

(71) Applicant: SAMSUNG ELECTRONICS CO., LTD., Suwon-si (KR)

(72) Inventors: Kiseok Lee, Hwaseong-si (KR); Keunnam Kim, Yongin-si (KR); Hui-Jung Kim, Seongnam-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 934 days.

(21) Appl. No.: 17/730,279

(22) Filed: Apr. 27, 2022

(65) Prior Publication Data

US 2023/0084388 A1     Mar. 16, 2023

(30) Foreign Application Priority Data

Sep. 10, 2021     (KR) ........................ 10-2021-0121147

(51) Int. Cl.
| | |
|---|---|
| *H10D 30/67* | (2025.01) |
| *H10W 20/41* | (2026.01) |
| *H10W 20/42* | (2026.01) |
| *H10H 20/01* | (2025.01) |
| *H10H 20/817* | (2025.01) |

(52) U.S. Cl.
CPC ..... *H10D 30/6755* (2025.01); *H10D 30/6713* (2025.01); *H10D 30/6757* (2025.01); *H10W 20/42* (2026.01); *H10W 20/435* (2026.01);

*H10D 30/6756* (2025.01); *H10H 20/0145* (2025.01); *H10H 20/817* (2025.01)

(58) Field of Classification Search
CPC ........... H01L 29/7869; H01L 29/78618; H01L 29/78696; H01L 29/78693; H01L 23/5226; H01L 23/5283; H01L 33/0058; H10D 30/6713; H10D 30/6757; H10D 30/6756; H10D 30/6755; H10D 30/6729; H10D 30/673; H10D 62/80; H10W 20/42; H10W 20/435; H10H 20/817
See application file for complete search history.

(56) References Cited

U.S. PATENT DOCUMENTS

| | | | | |
|---|---|---|---|---|
| 5,894,151 A | * | 4/1999 | Yamazaki | .......... H10D 30/6757 257/349 |
| 6,867,078 B1 | * | 3/2005 | Green | .................. H10D 64/411 257/E29.127 |
| 9,123,820 B2 | | 9/2015 | Katoh | |

(Continued)

FOREIGN PATENT DOCUMENTS

| | | |
|---|---|---|
| JP | 5814712 B2 | 11/2015 |
| KR | 100128724 B1 | 4/1998 |

(Continued)

*Primary Examiner* — Ida M Soward
(74) *Attorney, Agent, or Firm* — Muir Patent Law, PLLC

(57) ABSTRACT

A semiconductor device includes a substrate, a gate electrode on the substrate, a channel layer between the substrate and the gate electrode, the channel layer including an amorphous oxide semiconductor, and a width of the gate electrode being greater than a width of the channel layer, a first conductive electrode connected to a first side surface of the channel layer, and a second conductive electrode connected to a second side surface of the channel layer.

20 Claims, 13 Drawing Sheets

10

(56)                References Cited

U.S. PATENT DOCUMENTS

| | | | | |
|---|---|---|---|---|
| 9,324,876 | B2 * | 4/2016 | Kobayashi | H10D 30/6755 |
| 9,711,092 | B2 | 7/2017 | Kishi | |
| 10,204,942 | B1 | 2/2019 | Song | |
| 2005/0282342 | A1 * | 12/2005 | Adan | H10D 30/6211 |
| | | | | 438/294 |
| 2007/0001173 | A1 * | 1/2007 | Brask | H10D 30/6212 |
| | | | | 257/E21.221 |
| 2008/0128760 | A1 | 6/2008 | Jun et al. | |
| 2011/0042670 | A1 * | 2/2011 | Sato | H10D 30/6755 |
| | | | | 257/E29.296 |
| 2013/0043479 | A1 * | 2/2013 | Kim | H10D 30/6757 |
| | | | | 257/E21.414 |
| 2013/0092940 | A1 * | 4/2013 | Tezuka | H10D 30/6755 |
| | | | | 257/E21.409 |
| 2015/0060844 | A1 * | 3/2015 | Miyairi | H10D 30/6715 |
| | | | | 257/43 |
| 2015/0228799 | A1 * | 8/2015 | Koezuka | H10D 30/6733 |
| 2016/0172389 | A1 * | 6/2016 | Kao | H10D 30/6713 |
| | | | | 257/66 |
| 2017/0117374 | A1 * | 4/2017 | Tanaka | H10D 30/6713 |
| 2017/0148912 | A1 * | 5/2017 | Chu | H10D 30/63 |
| 2018/0114854 | A1 | 4/2018 | Xie | |
| 2018/0358469 | A1 * | 12/2018 | Uchida | G02F 1/1368 |
| 2020/0098934 | A1 | 3/2020 | Shivaraman et al. | |
| 2020/0203535 | A1 * | 6/2020 | Choi | H10D 30/6729 |
| 2020/0251469 | A1 * | 8/2020 | Chang | H10D 84/84 |
| 2020/0273998 | A1 | 8/2020 | Jambunathan et al. | |
| 2021/0050455 | A1 | 2/2021 | Le et al. | |
| 2021/0083122 | A1 | 3/2021 | Naylor et al. | |
| 2021/0125985 | A1 * | 4/2021 | Chang | H10D 64/64 |
| 2024/0038768 | A1 * | 2/2024 | Hanada | H10D 99/00 |

FOREIGN PATENT DOCUMENTS

| | | | | |
|---|---|---|---|---|
| KR | 10-2011-0074355 | A | 6/2011 | |
| KR | 1020130040137 | A | 4/2013 | |
| KR | 20130136063 | A * | 12/2013 | H10D 30/6757 |

* cited by examiner

SEMICONDUCTOR DEVICE INCLUDING AMORPHOUS OXIDE SEMICONDUCTOR CHANNEL LAYER

CROSS-REFERENCE TO RELATED APPLICATION

This U.S. non-provisional patent application claims priority under 35 U.S.C. § 119 to Korean Patent Application No. 10-2021-0121147, filed on Sep. 10, 2021, in the Korean Intellectual Property Office, the entire contents of which are hereby incorporated by reference.

BACKGROUND

1. Field

The present disclosure relates to a semiconductor device and, more particularly, to an oxide thin film transistor.

2. Description of the Related Art

Transistors are widely used as switching devices or driving devices in electronic devices. In particular, thin film transistors may also be formed on a glass substrate or a plastic substrate and thus may be used in display devices, e.g., organic light emitting display devices and/or liquid crystal display devices. The performance of a thin film transistor may be mainly affected by physical properties of a channel layer (e.g., a semiconductor layer).

Thin film transistors with excellent performance have been demanded to realize next-generation high-performance and highly integrated semiconductor circuits. Thus, an oxide thin film transistor using an oxide semiconductor having a high carrier mobility as a material of a channel layer has been studied.

SUMMARY

In an aspect, a semiconductor device may include a substrate, a gate electrode provided on the substrate, a channel layer provided between the substrate and the gate electrode, a first conductive electrode disposed to be connected to a first side surface of the channel layer, and a second conductive electrode disposed to be connected to a second side surface of the channel layer. The channel layer may include an amorphous oxide semiconductor. A width of the gate electrode may be greater than a width of the channel layer.

In an aspect, a semiconductor device may include a substrate, a gate electrode provided on the substrate, a channel layer provided between the substrate and the gate electrode, a first conductive electrode disposed to be connected to a first side surface of the channel layer, and a second conductive electrode disposed to be connected to a second side surface of the channel layer. The channel layer may include an amorphous oxide semiconductor. A width of the channel layer may become progressively less from a bottom surface of the channel layer toward a top surface of the channel layer.

In an aspect, a semiconductor device may include a substrate, a first conductive electrode provided on the substrate, the first conductive electrode including a source region and a first conductive via, a second conductive electrode provided on the substrate, the second conductive electrode including a drain region and a second conductive via, a channel layer provided between the first conductive electrode and the second conductive electrode on the substrate, a gate electrode provided to cover three surfaces of the channel layer, a gate oxide layer provided between the channel layer and the gate electrode and between the substrate and the gate electrode, and an insulating layer provided on the substrate to cover the first conductive electrode, the second conductive electrode, the channel layer, and the gate electrode. The first conductive via and the second conductive via may penetrate the insulating layer. A width of the channel layer may be less than a width of the gate electrode.

BRIEF DESCRIPTION OF THE DRAWINGS

Features will become apparent to those of skill in the art by describing in detail exemplary embodiments with reference to the attached drawings, in which:

FIGS. 4A, 4B and 5 are enlarged views of region 'A' of FIG. 2.

DETAILED DESCRIPTION

Figure 1:
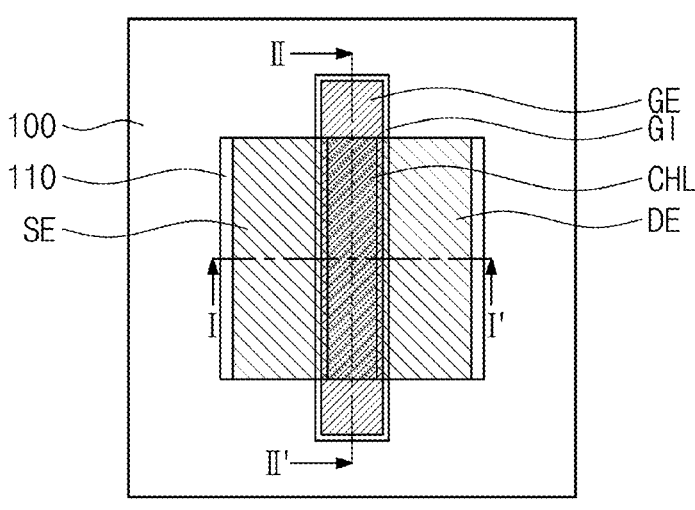
FIG. 1 is a plan view illustrating a semiconductor device according to some embodiments.
Figure 1:
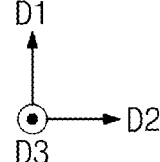
Figure 2:
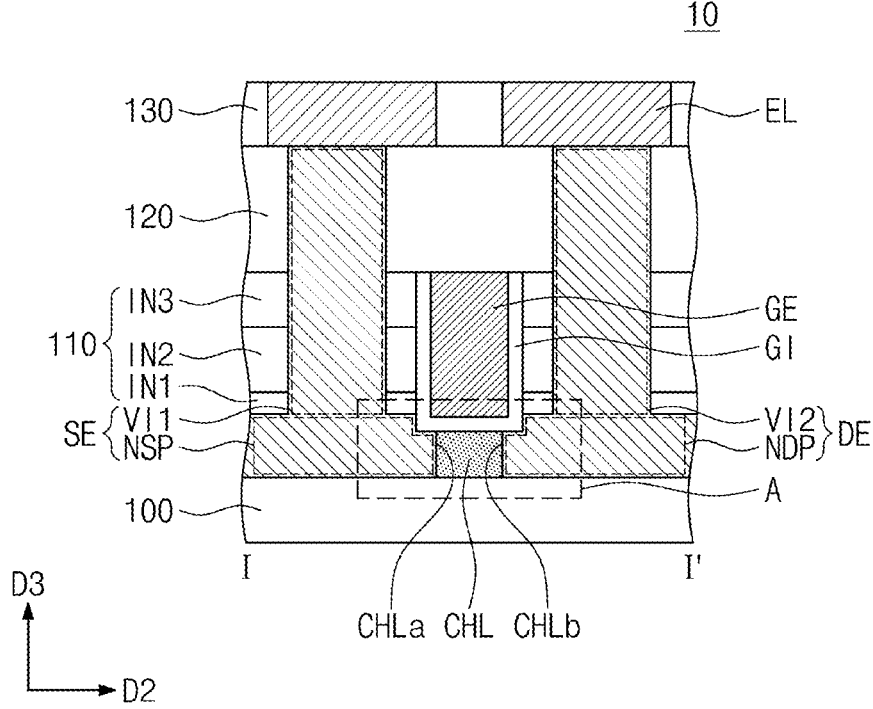
FIG. 2 is a cross-sectional view taken along line I-I' of FIG. 1 to illustrate a semiconductor device according to some embodiments.
Figure 3:
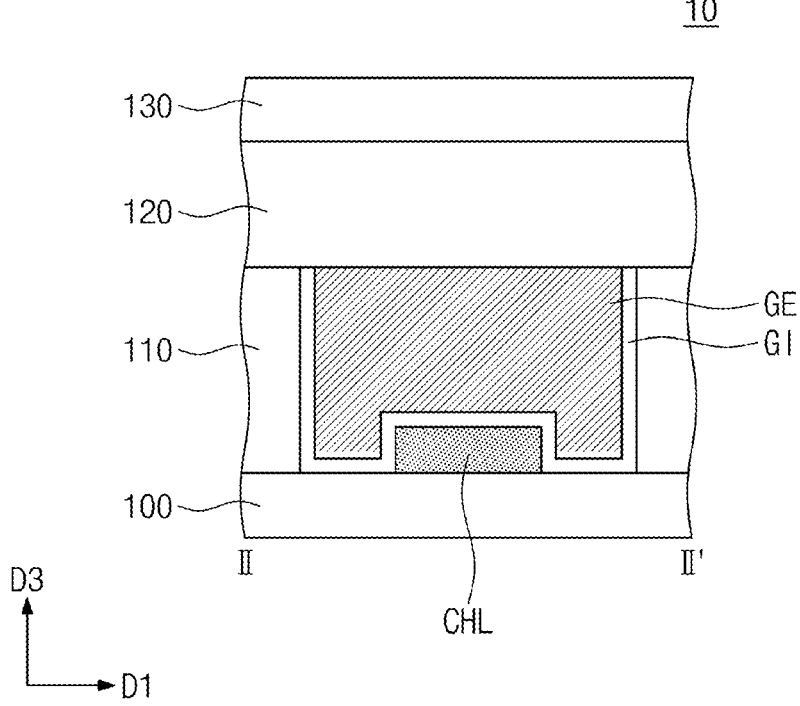
FIG. 3 is a cross-sectional view taken along line II-II' of FIG. 1 to illustrate a semiconductor device according to some embodiments.
Figure 6:
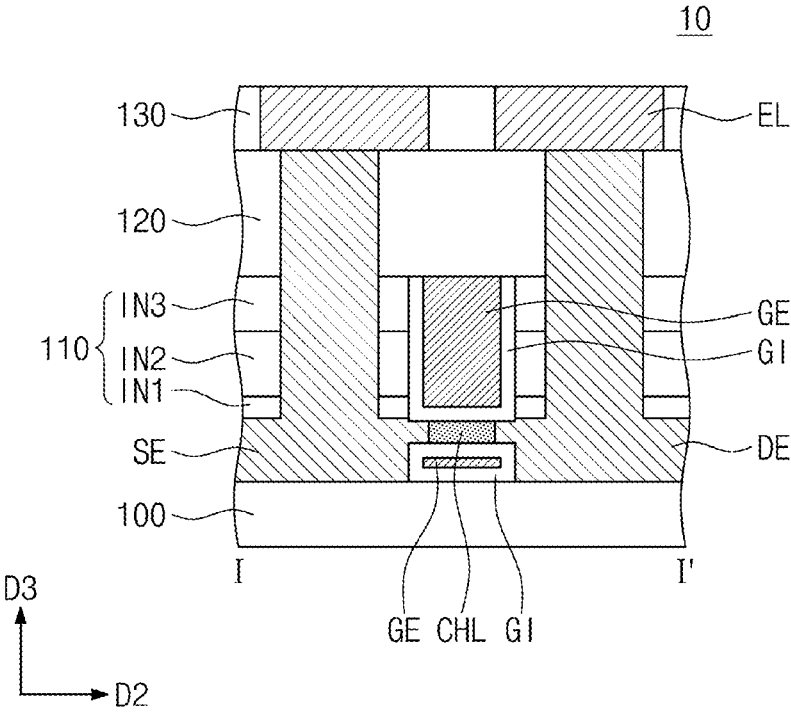
FIG. 6 is a cross-sectional view taken along line I-I' of FIG. 1 to illustrate a semiconductor device according to some embodiments.
Figure 7:
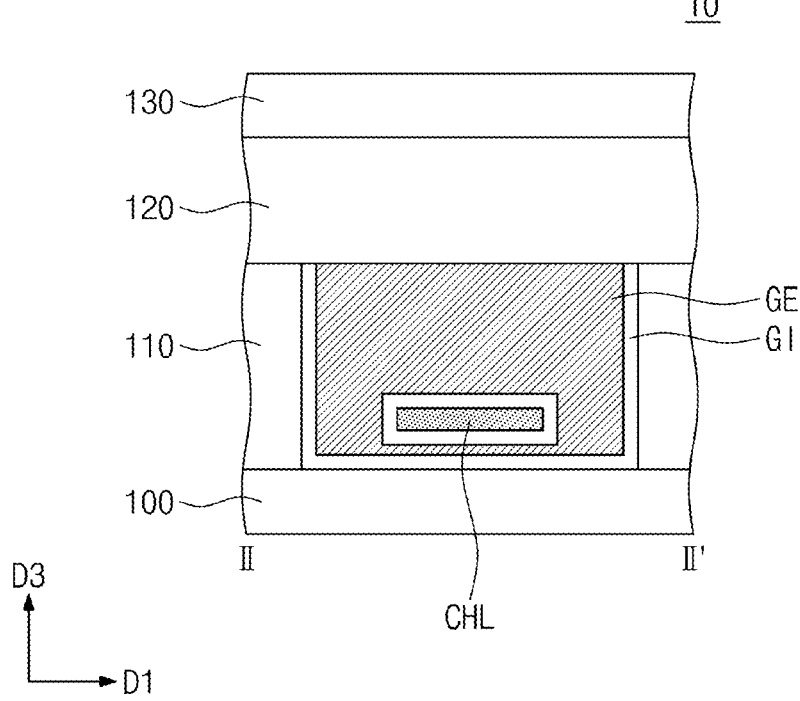
FIG. 7 is a cross-sectional view taken along line II-II' of FIG. 1 to illustrate a semiconductor device according to some embodiments.

FIG. 1 is a plan view illustrating a semiconductor device according to some embodiments. FIG. 2 is a cross-sectional view taken along line I-I' of FIG. 1, FIG. 3 is a cross-sectional view taken along line II-II' of FIG. 1, and FIGS. 4A, 4B, and 5 are enlarged views of region 'A' of FIG. 2. FIG. 6 is a cross-sectional view taken along line I-I' of FIG. 1 to illustrate a semiconductor device according to other embodiments, and FIG. 7 is a cross-sectional view taken along line II-II' of FIG. 1 to illustrate a semiconductor device according to other embodiments. Hereinafter, semiconductor devices according to some embodiments will be described with reference to FIGS. 1 to 7.

Referring to FIGS. 1, 2, and 3, a semiconductor device 10 according to some embodiments may include a channel layer CHL, a gate oxide layer GI, a gate electrode GE, a source electrode SE, and a drain electrode DE, which are provided on a substrate 100. In some embodiments, the semiconductor device 10 may be a transistor including an oxide thin film (or oxide thin layer).

For example, the substrate 100 may be a semiconductor substrate, a glass substrate, or a plastic substrate. The semiconductor substrate may include, e.g., silicon, germanium, and/or silicon-germanium. The semiconductor substrate may be, e.g., a silicon wafer. The substrate 100 may be disposed on a plane defined by a first direction D1 and a second direction D2 intersecting the first direction D1.

The channel layer CHL may be provided on the substrate 100. The channel layer CHL may include a semiconductor material which is capable of being formed on the substrate 100 by using a deposition process. The channel layer CHL may include a semiconductor material which is capable of functioning as a channel of a thin film transistor even though it is formed in an amorphous state by the deposition process, e.g., the channel layer CHL may be an amorphous deposition product.

In some embodiments, the channel layer CHL may include an amorphous oxide semiconductor. In particular, the channel layer CHL may include a compound of oxygen (O) and at least two metals, e.g., at least two of zinc (Zn), indium (In), gallium (Ga) and tin (Sn). For example, the channel layer CHL may include indium gallium zinc oxide (IGZO) or indium tin zinc oxide (ITZO).

In certain embodiments, the channel layer CHL may include a two-dimensional semiconductor. In particular, the channel layer CHL may include a metal chalcogenide, a transition metal chalcogenide, graphene, or phosphorene. The metal chalcogenide or transition metal chalcogenide may be a metal compound expressed by a chemical formula of $MX_y$ (e.g., 'y' is an integral number of 1, 2 or 3). In the chemical formula, 'M' is a metal or transition metal atom and may include, e.g., W, Mo, Ti, Zn, Zs, or Zr, and 'X' is a chalcogen atom and may include, e.g., S, Se, O, or Te. For example, the channel layer CHL may include one of, e.g., graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, $ZnO$, $ZnS_2$, $ZsSe_2$, $WO_3$, and $MoO_3$. The channel layer CHL may have a mono-layered structure or a multi-layered structure in which 2 to 100 layers are stacked. The multi-layered structure may be formed of adjacent monolayers coupled to each other by van der Waals force.

The source electrode SE and the drain electrode DE may be disposed at both, e.g., opposite, sides of the channel layer CHL in the second direction D2, respectively. A first side surface CHLa of the channel layer CHL may be connected directly to the source electrode SE. A second side surface CHLb of the channel layer CHL may be connected directly to the drain electrode DE.

The source electrode SE may include a lower source region NSP and a first conductive via VI1. The lower source region NSP may be provided, e.g., directly, on the substrate 100 and may extend in the first direction D1 and the second direction D2. A side surface of the lower source region NSP may be connected directly to the first side surface CHLa of the channel layer CHL, e.g., the first side surface CHLa of the channel layer CHL may extend along an entire length of the side surface of the lower source region NSP in the first direction D1. A level of a top surface of the lower source region NSP may be the same as or higher than a level of a top surface of the channel layer CHL, e.g., relative to a bottom of the substrate 100. The first conductive via VI1 may extend from the top surface of the lower source region NSP in a third direction D3. The first conductive via VI1 may be spaced apart from the gate oxide layer GI to be described later in detail. A first insulating layer 110 to be described later may be provided between the first conductive via VI1 and the gate oxide layer GI.

The drain electrode DE may include a lower drain region NDP and a second conductive via VI2. The lower drain region NDP may be provided, e.g., directly, on the substrate 100 and may extend in the first direction D1 and the second direction D2. A side surface of the lower drain region NDP may be connected directly to the second side surface CHLb of the channel layer CHL, e.g., the second side surface CHLb of the channel layer CHL may extend along an entire length of the side surface of the lower drain region NDP in the first direction D1. A level of a top surface of the lower drain region NDP may be the same as or higher than a level of a top surface of the channel layer CHL, e.g., relative to a bottom of the substrate 100. The second conductive via VI2 may extend from the top surface of the lower drain region NDP in the third direction D3. The second conductive via VI2 may be spaced apart from the gate oxide layer GI to be described later in detail. The first insulating layer 110 to be described later in detail may be provided between the second conductive via VI2 and the gate oxide layer GI.

The source electrode SE and the drain electrode DE may include a conductive material. For example, each of the source electrode SE and the drain electrode DE may include at least one of a doped semiconductor material (e.g., doped silicon or doped germanium), a conductive metal nitride (e.g., titanium nitride or tantalum nitride), or a metal material (e.g., titanium, tantalum, tungsten, copper, or aluminum).

Figure 4A:
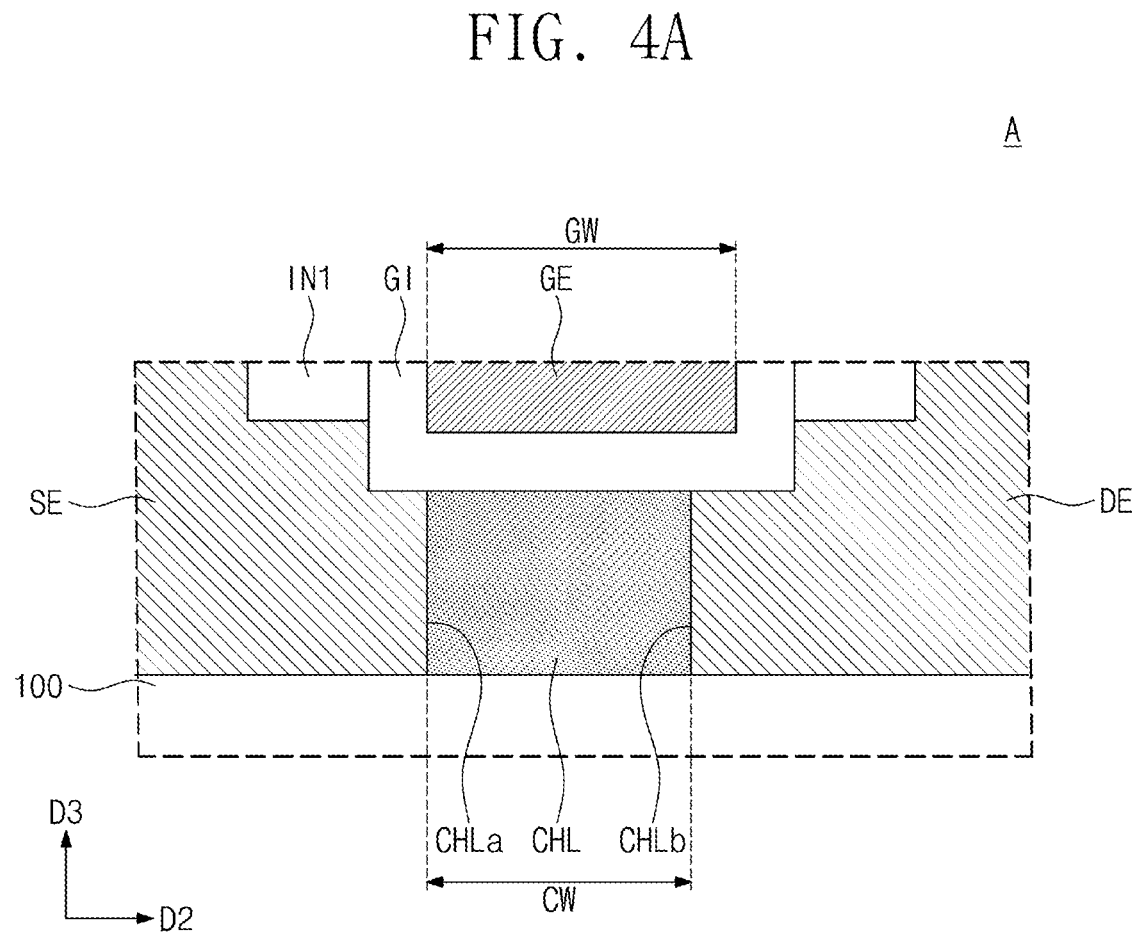
Figure 4B:
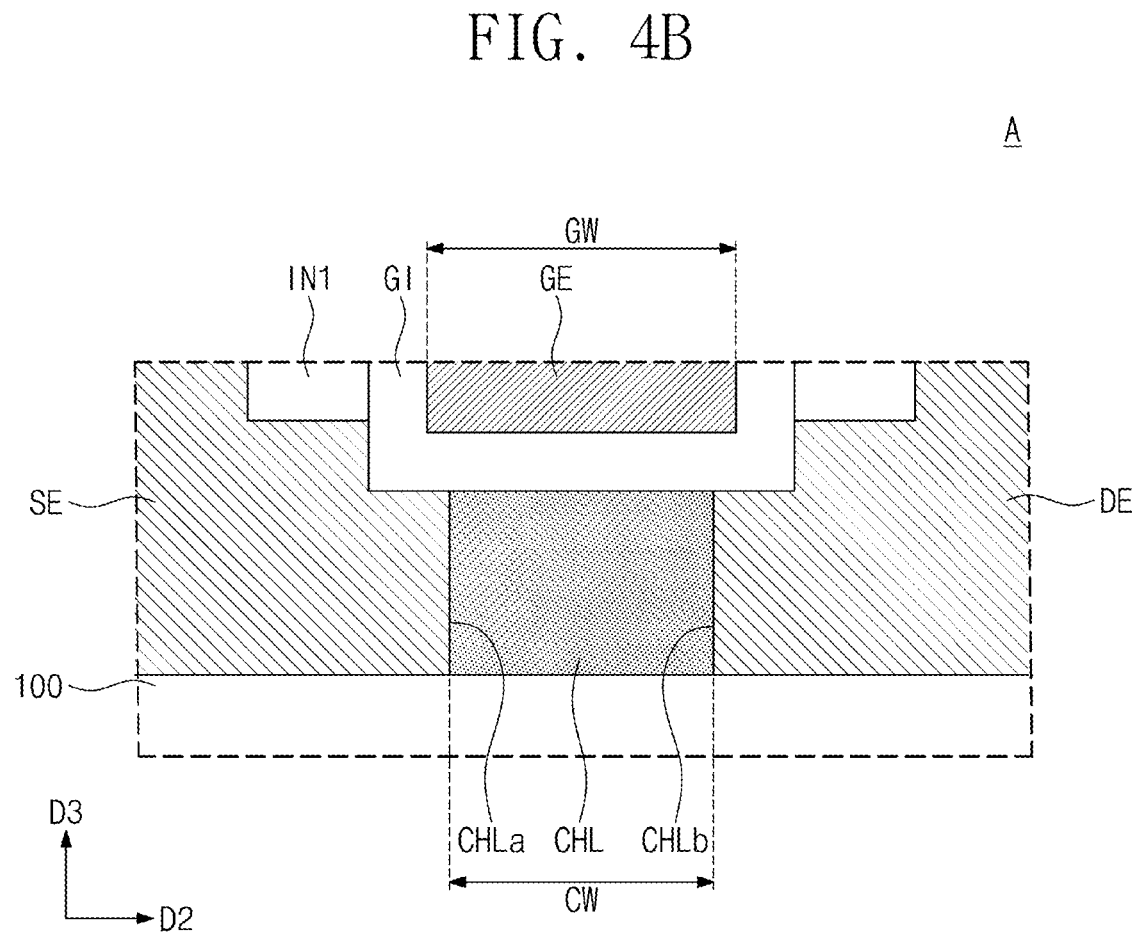

Referring to FIGS. 2, 4A and 4B, in some embodiments, the channel layer CHL may have a cross section having a rectangular shape. A width CW of the channel layer CHL may be defined in the cross section of the channel layer CHL. The width CW of the channel layer CHL may be defined as a length from the first side surface CHLa to an opposite side surface (i.e., the second side surface CHLb) of the channel layer CHL in the second direction D2.

The width CW of the channel layer CHL may be equal to or less than a width GW of the gate electrode GE, e.g., in the second direction D2. For example, as illustrated in FIG. 4A, the first side surface CHLa of the channel layer CHL may be vertically aligned, e.g., level, with a first side surface of the gate electrode GE. The second side surface CHLb of the channel layer CHL may be disposed inside an opposite side surface of the gate electrode GE, e.g., the second side surface CHLb of the channel layer CHL may be at a position between opposite side surfaces of the gate electrode GE in the second direction D2. In other words, referring to FIG. 4A, a width of the gate electrode GE along the second direction D2 may be larger than that of the channel layer CHL, such that the second side surface CHLb of the channel layer CHL may vertically overlap with the gate electrode GE (rather than its second side surface), e.g., the second side surface CHLb of the channel layer CHL may be spaced apart from the second side surface of the gate electrode GE toward the first side surface of the gate electrode GE. At least one of both side surfaces CHLa and CHLb of the channel layer CHL may vertically overlap with the gate electrode GE, e.g., at least one of side surfaces CHLa and CHLb of the channel layer CHL may vertically overlap with a portion of the gate electrode GE between the opposite side surfaces of the gate electrode GE. In other words, the channel layer CHL may vertically overlap with at least a portion of the gate electrode GE, e.g., the gate electrode GE may overlap an entire width of the channel layer CHL and extend beyond the channel layer CHL in the second direction D2. In another example, as illustrated in FIG. 4B, the channel layer CHL may be centered with respect to the gate electrode GE.

Figure 5:
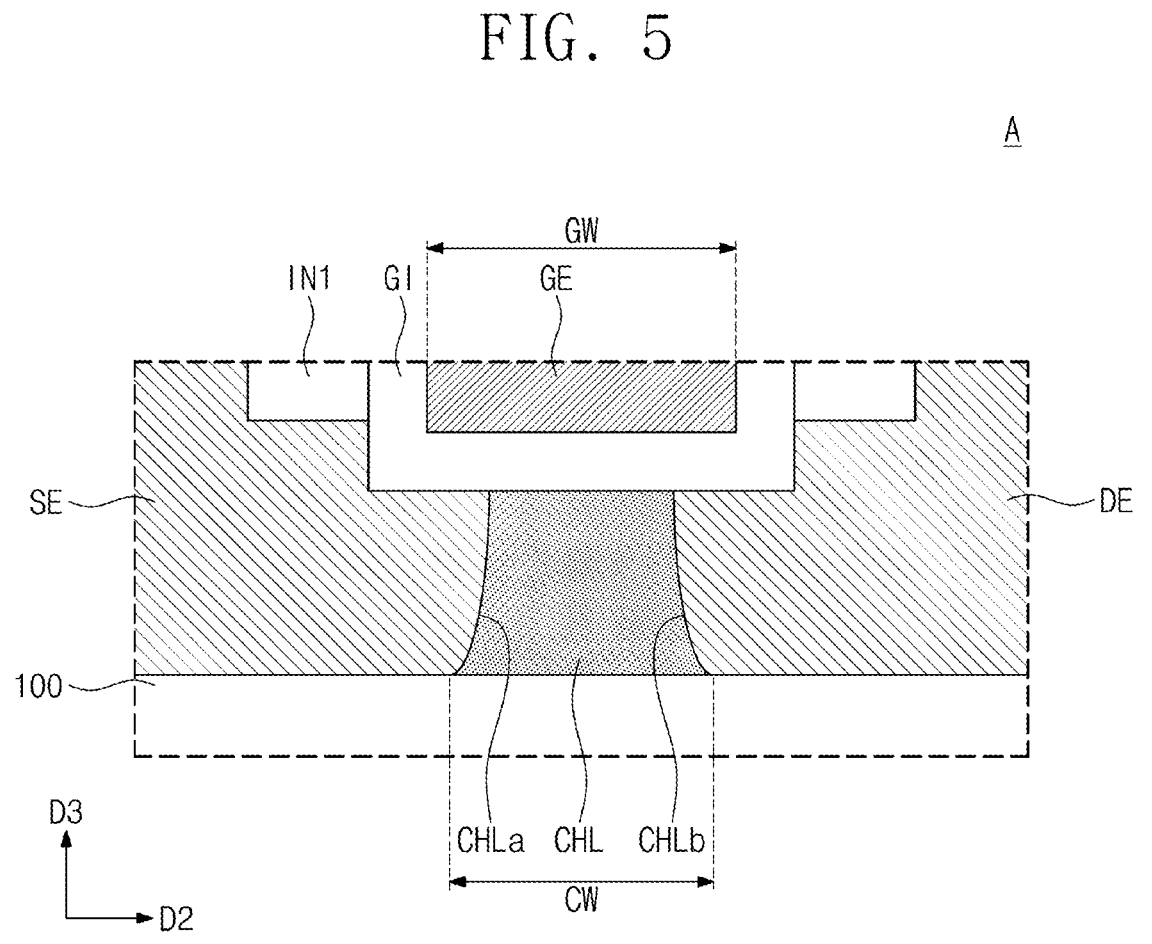

Referring to FIGS. 2 and 5, in certain embodiments, the width CW of the channel layer CHL may progressively decrease as a level from a top surface of the substrate 100 in the third direction D3 increases. The width CW of the channel layer CHL may have a minimum width at a portion meeting the gate oxide layer GI, and may have a maximum width at a portion meeting the top surface of the substrate 100. The minimum width and the maximum width may be less than the width GW of the gate electrode GE. In other words, the channel layer CHL may vertically overlap with at least a portion of the gate electrode GE.

In the embodiments described with reference to FIGS. 4A, 4B, and 5, when a voltage is applied to the gate electrode GE, a channel may be formed in an upper portion of the channel layer CHL adjacent to the gate oxide layer GI, and a current may flow through the channel. A length of the channel formed in the upper portion of the channel layer CHL in the embodiments may be shortened as compared with a case in which a width of a channel layer is greater than a width of a gate electrode. Thus, when a current flows between the source electrode SE and the drain electrode DE, a resistance in the channel layer CHL may be reduced, a leakage current may be reduced, and a drive current may be increased.

Referring again to FIGS. 1, 2, and 3, in some embodiments, the gate oxide layer GI and the gate electrode GE may be sequentially provided on the channel layer CHL. The gate oxide layer GI may be provided to cover a top surface and side surfaces of the channel layer CHL along the first direction D1 (FIG. 3). A portion of a bottom surface of the gate oxide layer GI may be provided directly on the substrate 100, and another portion of the bottom surface of the gate oxide layer GI may be provided on the channel layer CHL. In other words, the gate oxide layer GI may be provided to cover three surfaces of the channel layer CHL along the first direction D1. The gate oxide layer GI may include, e.g., a silicon nitride layer, a silicon oxide layer, or a silicon oxynitride layer.

The gate oxide layer GI may be provided to surround a bottom surface and side surfaces of the gate electrode GE. In other words, the gate electrode GE may be provided in an inner region surrounded by the gate oxide layer GI. The gate oxide layer GI may be provided between the gate electrode GE and the channel layer CHL and between the gate electrode GE and the substrate 100. A structure of the gate oxide layer GI and the gate electrode GE may be a tri-gate structure, e.g., a three-dimensional structure that directly contacts and surrounds three different surfaces of a raised element (e.g., the channel layer CHL). When a voltage is applied to the gate electrode GE, a channel may be formed in the channel layer CHL adjacent to the gate oxide layer GI.

The gate electrode GE may include at least one of a doped semiconductor material (e.g., doped silicon or doped germanium), a conductive metal nitride (e.g., titanium nitride or tantalum nitride), or a metal material (e.g., titanium, tantalum, tungsten, copper, or aluminum).

Referring to FIGS. 1, 6, and 7, in certain embodiments, the gate oxide layer GI may be provided to surround a top surface, a bottom surface, and side surfaces of the channel layer CHL along the first direction D1. The channel layer CHL may be spaced apart from the substrate 100. The gate oxide layer GI and the gate electrode GE may be provided between the channel layer CHL and the substrate 100. In other words, a structure of the gate oxide layer GI and the gate electrode GE may be a gate-all-around (GAA) structure. When a voltage is applied to the gate electrode GE, a channel may be formed in the channel layer CHL surrounded by the gate oxide layer GI and the gate electrode GE.

The first insulating layer 110 may be provided on the lower source region NSP of the source electrode SE and the lower drain region NDP of the drain electrode DE. For example, the first insulating layer 110 may include a first sub-insulating layer IN1, a second sub-insulating layer IN2, and a third sub-insulating layer IN3. Each of the first to third sub-insulating layers IN1, IN2, and IN3 may have an etch selectivity with respect to other sub-insulating layer adjacent thereto. For example, each of the first to third sub-insulating layers IN1, IN2, and IN3 may be a silicon oxide layer or a silicon nitride layer.

The first conductive via VI1, the second conductive via VI2, the gate oxide layer GI, and the gate electrode GE may penetrate the first insulating layer 110. In the first insulating layer 110, the first conductive via VI1 may be spaced apart from the gate oxide layer GI, and the second conductive via VI2 may also be spaced apart from the gate oxide layer GI. In other words, the first insulating layer 110 may be provided between the gate oxide layer GI and each of the conductive vias VI1 and VI2.

A top surface of the first insulating layer 110 may be located at substantially the same level as top surfaces of the gate oxide layer GI and the gate electrode GE. In other words, the gate oxide layer GI and the gate electrode GE may be exposed at the top surface of the first insulating layer 110, e.g., top surfaces of the gate oxide layer GI, the gate electrode GE, and the first insulating layer 110 may be coplanar.

A second insulating layer 120 may be provided on the first insulating layer 110. The second insulating layer 120 may be provided on the gate oxide layer GI and the gate electrode GE. The first conductive via VI1 of the source electrode SE and the second conductive via VI2 of the drain electrode DE may penetrate the second insulating layer 120. A top surface of the second insulating layer 120 may be located at substantially the same level as top surfaces of the first conductive via VI1 and the second conductive via VI2. The first conductive via VI1 and the second conductive via VI2 may be exposed at the top surface of the second insulating layer 120, e.g., top surfaces of the first conductive via VI1, the second conductive via VI2, and the second insulating layer 120 may be coplanar.

A third insulating layer 130 may be provided on the second insulating layer 120. The third insulating layer 130 may include interconnection lines EL. Each of the interconnection lines EL may be connected to the top surface of the first conductive via VI1 or the top surface of the second conductive via VI2. Different voltages may be applied to the interconnection lines EL, respectively. In other words, a voltage applied to the first conductive via VI1 of the source electrode SE may be different from a voltage applied to the second conductive via VI2 of the drain electrode DE. A contact connected to the gate electrode GE may further be provided in the second insulating layer 120 to apply a voltage to the gate electrode GE.

FIGS. 8 to 14 are cross-sectional views of stages in a method of manufacturing a semiconductor device according to some embodiments. Hereinafter, a method of manufacturing the semiconductor device 10 according to some embodiments will be described with reference to FIGS. 8 to 14.

Figure 8:
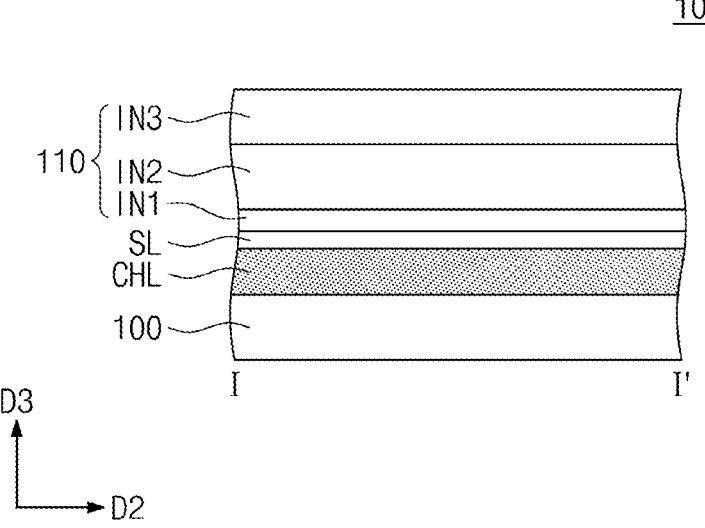
FIGS. 8 to 14 are cross-sectional views of stages in a method of manufacturing a semiconductor device according to some embodiments.

Referring to FIG. 8, the channel layer CHL, an etch stop layer SL, and the first insulating layer 110 may be sequentially formed on the substrate 100 in the third direction D3. The channel layer CHL may be formed using a deposition process. The deposition process may include a low-temperature evaporation process. The deposition process may be performed in an environment of 50 degrees Celsius to 400 degrees Celsius. For example, the deposition process may include a physical vapor deposition (PVD) process or a chemical vapor deposition (CVD) process. Thus, the semiconductor device according to embodiments may be formed in a front-end-of-line (FEOL) layer on the substrate 100, in a back-end-of-line (BEOL) layer, and/or in a peri structure of a peri-on-cell (POC) structure (see FIGS. 16 and 17), as described below.

The etch stop layer SL and the first insulating layer 110 formed on the channel layer CHL may have an etch selectivity with respect to each other. For example, each of the etch stop layer SL and first to third sub-insulating layers IN1, IN2, and IN3 may be a silicon oxide layer or a silicon nitride layer. The first insulating layer 110 may include the first to third sub-insulating layers IN1, IN2, and IN3, and in this case, the first to third sub-insulating layers IN1, IN2, and IN3 may have an etch selectivity with respect to each other.

Figure 9:
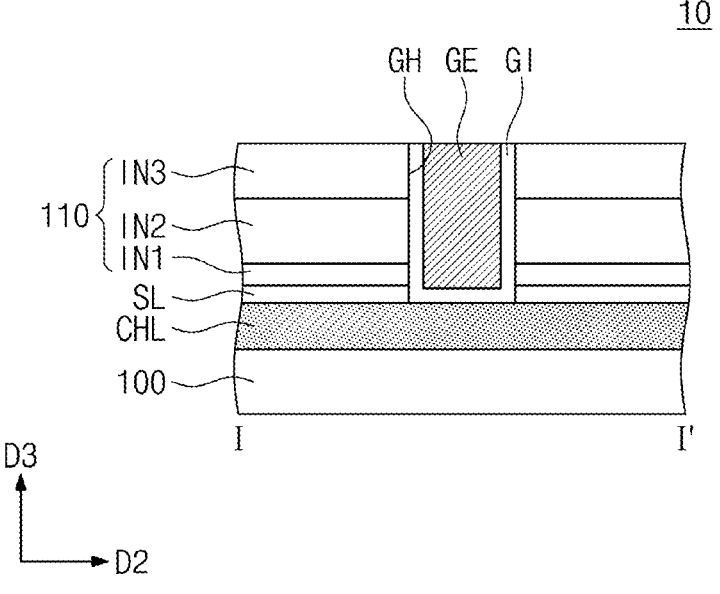

Referring to FIG. 9, a gate hole GH may be formed to penetrate the first insulating layer 110 and the etch stop layer SL. The gate hole GH may expose a portion of a top surface of the channel layer CHL. The gate oxide layer GI and the gate electrode GE may be sequentially formed in the gate hole GH. The gate oxide layer GI may be formed, e.g., conformally, on the gate hole GH to have an inner space while covering an inner side surface and a bottom surface of the gate hole GH. For example, the gate oxide layer GI may have a cylinder shape. The gate electrode GE may be formed in the inner space, e.g., to completely fill a remainder of the gate hole GH above the gate oxide layer GI. The formation of the gate electrode GE may include an electroless plating process and/or an electroplating process.

Figure 10:
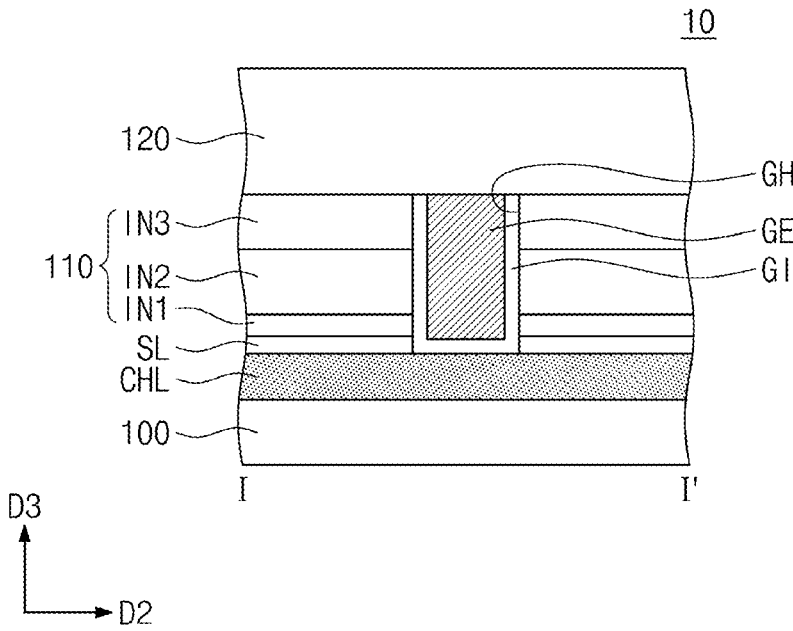

Referring to FIG. 10, the second insulating layer 120 may be formed on the first insulating layer 110, the gate oxide layer GI, and the gate electrode GE. The formation of the second insulating layer 120 may include a deposition process. The second insulating layer 120 may be provided on the gate electrode GE to cover the gate electrode GE.

Figure 11:
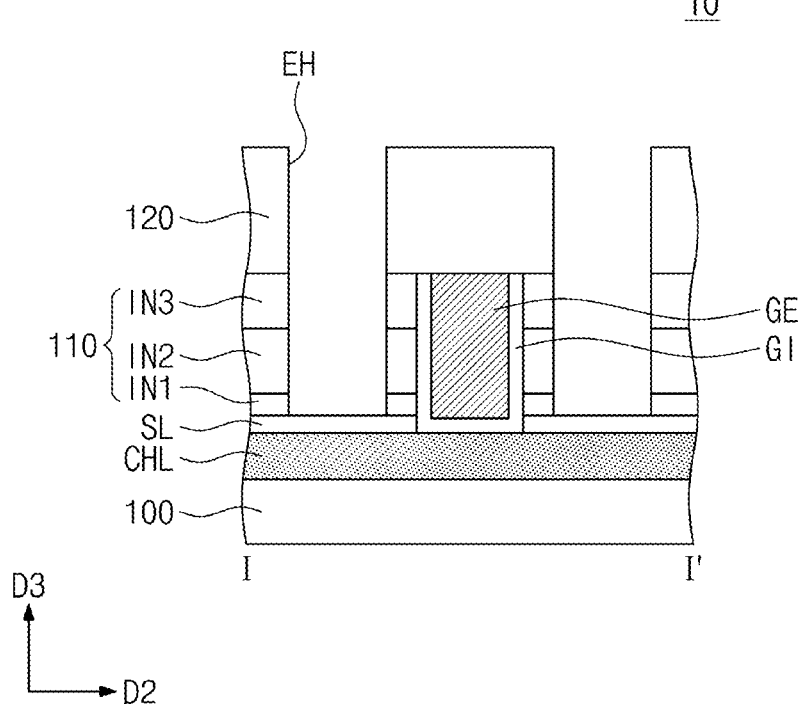

Referring to FIG. 11, electrode holes EH may be formed in the first insulating layer 110 and the second insulating layer 120. The electrode holes EH may be formed at positions at which the source electrode SE and the drain electrode DE will be provided (see FIGS. 2 and 6). In other words, each of the electrode holes EH may be formed to be spaced apart from the gate oxide layer GI.

Each of the electrode holes EH may penetrate the first and second insulating layers 110 and 120 from a top surface of the second insulating layer 120 to a top surface of the etch stop layer SL. In other words, the electrode holes EH may expose the etch stop layer SL.

Figure 12:
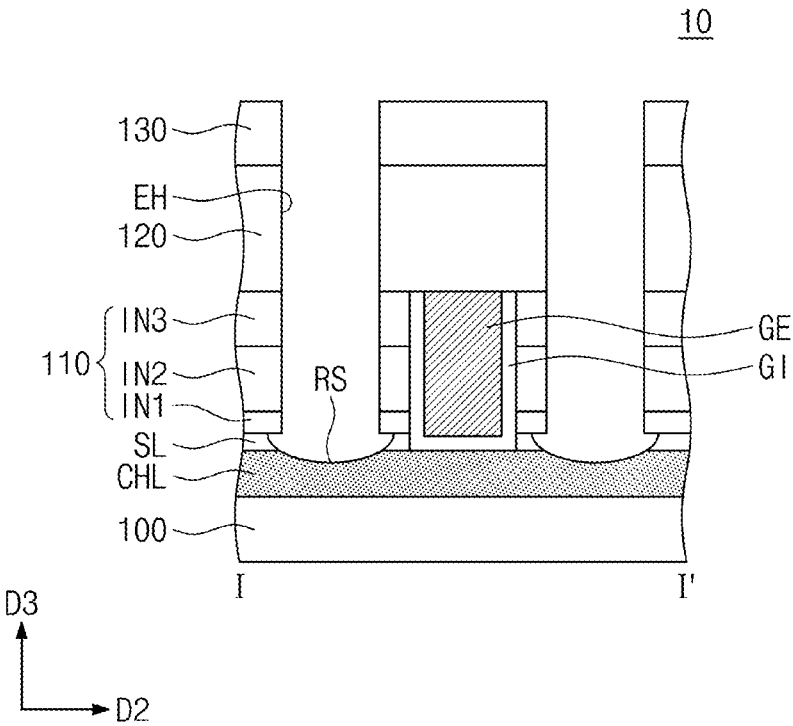
Figure 13:
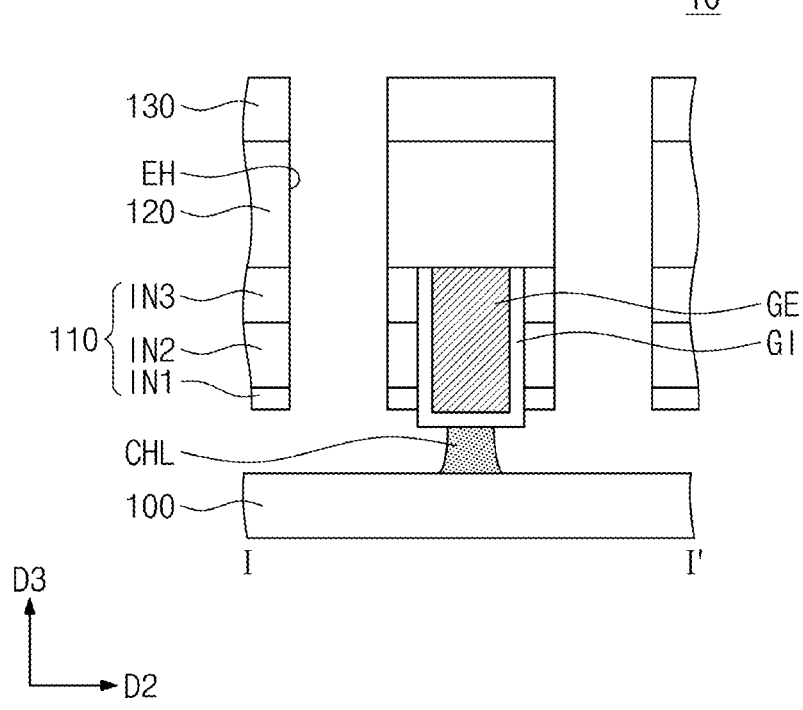

Referring to FIGS. 12 and 13, the etch stop layer SL exposed through the electrode holes EH and the channel layer CHL under the etch stop layer SL may be gradually removed from their surfaces to form recesses RS. The recesses RS may be formed using an isotropic etching process. For example, the formation of the recesses RS may include a wet etching process. As the etching process progresses, the etch stop layer SL and the channel layer CHL may be gradually removed from portions close to the electrode holes EH toward portions far from the electrode holes EH. The etching process may be performed until both side surfaces of the channel layer CHL are laterally recessed from both side surfaces of the gate electrode GE (e.g., until both side surfaces of the channel layer CHL are located under the gate electrode GE). In other words, the etching process may be performed until a maximum width CW of the channel layer CHL in the second direction D2 is less than a width GW of the gate electrode GE.

Figure 14:
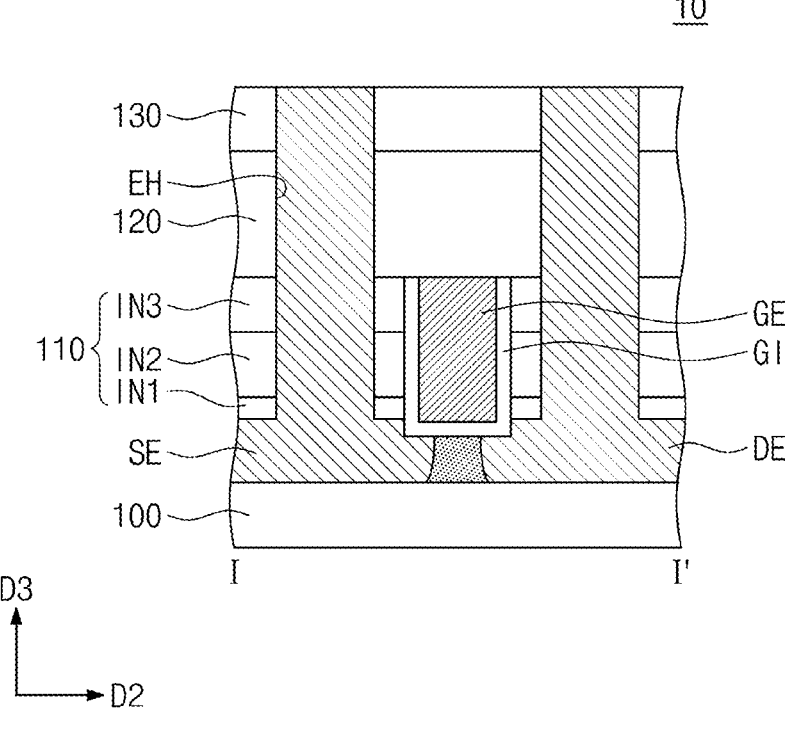

Referring to FIG. 14, a conductive material may be formed in, e.g., to completely fill, the electrode holes EH to form the source electrode SE and the drain electrode DE.

Thus, the source electrode SE may be connected directly to a side surface of the channel layer CHL, and the drain electrode DE may be connected directly to an opposite side surface of the channel layer CHL.

Figure 15:
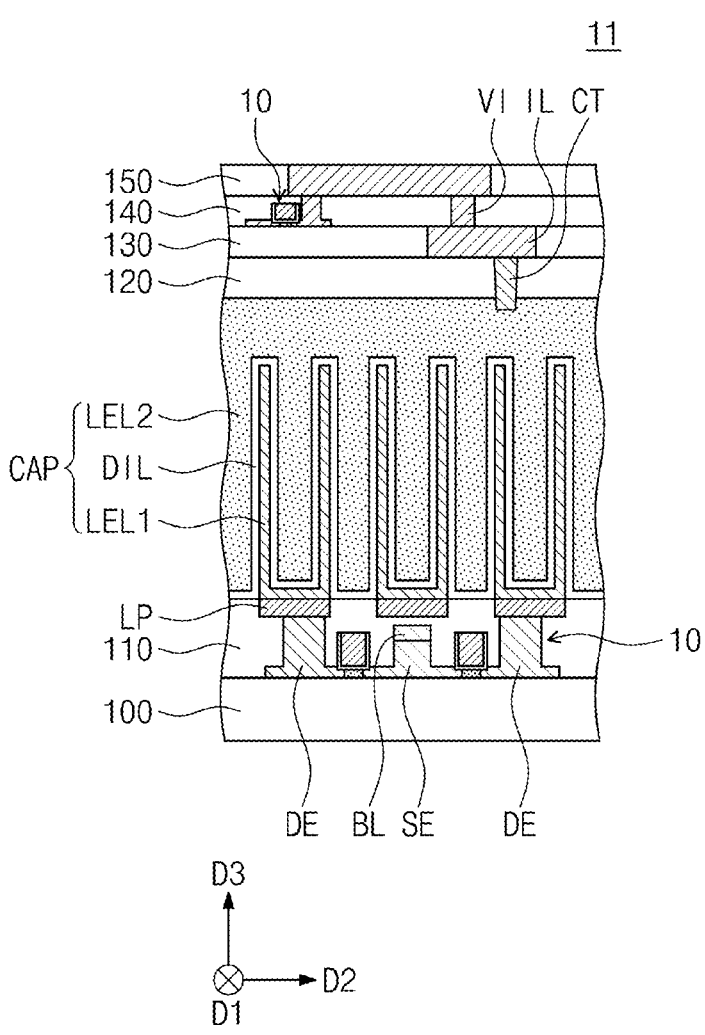
FIGS. 15 to 17 are views illustrating application examples including semiconductor devices according to some embodiments.
Figure 16:
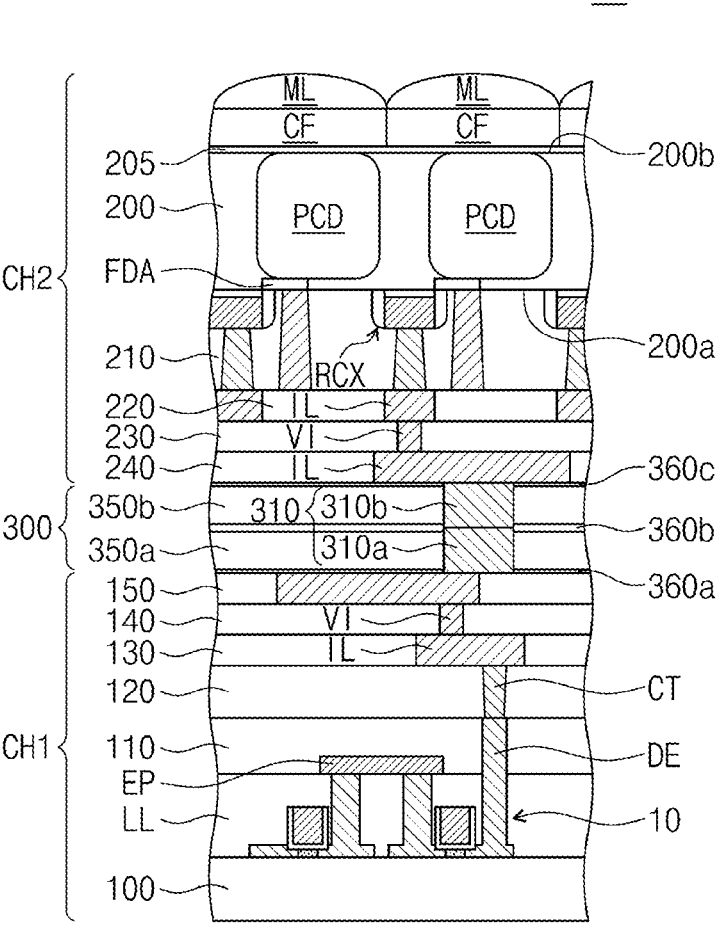
Figure 17:
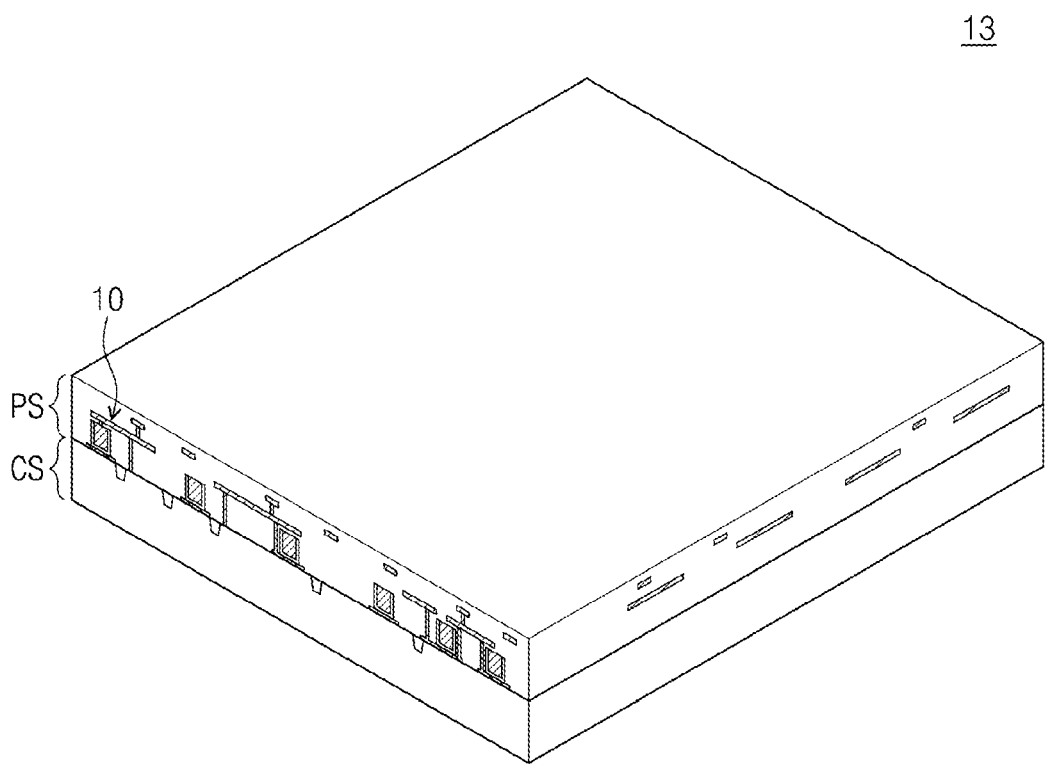

FIGS. 15 to 17 are views illustrating application examples including semiconductor devices according to some embodiments. Hereinafter, application examples will be described with reference to FIGS. 15 to 17.

FIG. 15 is a view illustrating a semiconductor memory cell 11 in which the semiconductor device 10 according to embodiments is provided. For example, the semiconductor device 10 may be a transistor. For example, the semiconductor memory cell 11 may be a semiconductor dynamic random-access memory (DRAM) cell.

Referring to FIG. 15, the semiconductor memory cell 11 may include the substrate 100 and capacitors CAP on the substrate 100. The semiconductor device 10 according to embodiments may be provided on the substrate 100.

For example, a pair of neighboring semiconductor devices 10 on the substrate 100 may share the source electrode SE. In other words, the source electrode SE may be provided between the pair of neighboring semiconductor devices 10.

The first insulating layer 110 may be provided on the substrate 100 to cover the semiconductor devices 10 according to embodiments. The first insulating layer 110 may include, e.g., a silicon oxide layer or a silicon oxynitride layer.

Bit lines BL may be provided in the first insulating layer 110. Each of the bit lines BL may be provided on the source electrode SE shared by the pair of neighboring semiconductor devices 10. For example, the bit lines BL may include at least one of a doped semiconductor material, a conductive metal nitride, a metal, or a metal-semiconductor compound.

Landing pads LP may be provided in the first insulating layer 110. Each of the landing pads LP may be disposed on the drain electrode DE of the semiconductor device 10. Each of the landing pads LP may include a conductive material, e.g., doped silicon and/or a metal.

The capacitors CAP may be disposed on the first insulating layer 110. The capacitors CAP may include first electrodes LEL1, a second electrode LEL2, and a dielectric layer DIL disposed between the first electrodes LEL1 and the second electrode LEL2. Each of the first electrodes LEL1 may be disposed on each of the landing pads LP. Each of the first electrodes LEL1 may be electrically connected to the drain electrode DE through the landing pad LP. The first electrodes LEL1 may be arranged in a line in the second direction D2.

Each of the first electrodes LEL1 may have a cylinder shape (or a cup shape) having a bottom portion and a sidewall portion vertically extending from the bottom portion. The bottom portion and the sidewall portion of each of the first electrodes LEL1 may have substantially the same thickness. Planar diameters of the first electrodes LEL1 may be substantially equal to each other.

The first electrodes LEL1 may include at least one of a doped semiconductor material, a conductive metal nitride, a metal, or a metal-semiconductor compound. For example, each of the first electrodes LEL1 may include a metal nitride layer, e.g., a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, or a tungsten nitride (WN) layer.

The dielectric layer DIL may be provided on surfaces of the first electrodes LEL1 with a substantially uniform thickness. For example, the dielectric layer DIL may include a high-k dielectric material, e.g., $HfO_2$, $ZrO_2$, $Al_2O_3$, $La_2O_3$, $Ta_2O_3$ and/or $TiO_2$.

The second electrode LEL2 may be provided on the dielectric layer DIL. The second electrode LEL2 may cover a plurality of the first electrodes LEL1 with the dielectric layer DIL interposed therebetween. A portion of the second electrode LEL2 may fill the inside of the first electrode LEL1 having the cylinder shape (or the cup shape). The second electrode LEL2 may include at least one of, e.g., a doped semiconductor material, a conductive metal nitride, a metal, or a metal-semiconductor compound. For example, the second electrode LEL2 may have a structure in which a metal nitride layer and a semiconductor layer are sequentially stacked.

The semiconductor devices 10, the first insulating layer 110, the landing pads LP, and the capacitors CAP on the substrate 100 may be formed by a front-end-of-line (FEOL) process.

Second to fifth insulating layers 120, 130, 140 and 150 may be sequentially stacked on the capacitors CAP. At least one contact CT may penetrate the second insulating layer 120 so as to be electrically connected to the second electrode LEL2. The semiconductor devices 10 according to embodiments, interconnection lines IL, and vias VI may be provided in the third to fifth insulating layers 130, 140 and 150. Additional semiconductor device 10 may be disposed on one of the second to fifth insulating layers 120, 130, 140 and 150 so as to be electrically connected to the interconnection line IL. The vias VI may vertically connect the interconnection lines IL. For example, the interconnection lines IL of the semiconductor memory cells 11 may be electrically connected to the capacitors CAP through the contact CT.

The interconnection lines IL, the additional semiconductor devices 10, and the vias VI provided in the second to fifth insulating layers 120, 130, 140 and 150 may be formed by a back-end-of-line (BEOL) process.

FIG. 16 is a view illustrating an image sensor to which the semiconductor device according to embodiments is applied. For example, the semiconductor device 10 may be a transistor.

Referring to FIG. 16, an image sensor chip 12 may include a first sub-chip CH1, a second sub-chip CH2, and an insertion layer 300. The first sub-chip CH1 may include the substrate 100, a circuit layer LL with the semiconductor device 10, and the first to fifth insulating layers 110, 120, 130, 140 and 150 on the substrate 100.

In detail, the circuit layer LL may include the semiconductor devices 10 according to embodiments. The semiconductor devices 10 may be spaced apart from each other and may be two-dimensionally arranged on the substrate 100. The semiconductor devices 10 may be used as logic transistors and may process signals transmitted from the second sub-chip CH2. The first to fifth insulating layers 110, 120, 130, 140 and 150 may be sequentially stacked on the circuit layer LL.

Lower interconnection lines EP may be provided in the first insulating layer 110. One of the lower interconnection lines EP may be disposed in common on the source electrode and the drain electrode of a pair of neighboring semiconductor devices 10. The drain electrode and the source electrode of the pair of neighboring semiconductor devices 10 may be electrically connected to each other through the lower interconnection line EP. The drain electrode DE not connected to the lower interconnection line EP may penetrate the first insulating layer 110. Each of the lower interconnection lines EP may include a conductive material, e.g., doped silicon and/or a metal.

At least one contact CT may penetrate the second insulating layer 120 so as to be electrically connected to the drain electrode DE. Interconnection lines IL and vias VI may be provided in the third to fifth insulating layers 130, 140 and 150. The vias VI may vertically connect the interconnection lines IL. For example, the interconnection lines IL of the first sub-chip CH1 may be electrically connected to the semiconductor devices 10 in the circuit layer LL through the contact CT.

The second sub-chip CH2 may include photoelectric conversion devices PCD, floating diffusion regions FDA, and readout circuit devices RCX formed in or on an additional substrate 200. The additional substrate 200 may be a semiconductor substrate which is doped with dopants to have a p-type conductivity.

The readout circuit devices RCX may be disposed on a first surface 200a of the additional substrate 200. The readout circuit devices RCX may include a plurality of transistors for transferring and amplifying electrical signals (e.g., photocharges) corresponding to incident light.

Color filters CF and micro lenses ML for providing incident light to the photoelectric conversion devices PCD may be disposed on a second surface 200b of the additional substrate 200. The second surface 200b may be opposite to the first surface 200a.

Each of the photoelectric conversion devices PCD may include a photodiode. The photoelectric conversion devices PCD may be disposed in the additional substrate 200. The photoelectric conversion devices PCD may generate photocharges corresponding to incident light. For example, electron-hole pairs corresponding to incident light may be generated in each of the photoelectric conversion devices PCD. The photoelectric conversion devices PCD may be doped with dopants to have a conductivity type (e.g., an n-type) different from that of the additional substrate 200.

Each of the color filters CF may be disposed on each of the photoelectric conversion devices PCD. The color filters CF may be arranged in a matrix form to constitute a color filter array.

In some embodiments, the color filter array may include a Bayer pattern including a red filter, a green filter, and a blue filter. Each of the color filters CF may be one of the red filter, the green filter, and the blue filter.

In certain embodiments, the color filter array may include a Bayer pattern including a yellow filter, a magenta filter, and a cyan filter. Each of the color filters CF may be one of the yellow filter, the magenta filter, and the cyan filter.

Each of the micro lenses ML may be disposed on each of the color filters CF. Each of the micro lenses ML may adjust a path of light incident thereto in such a way that the incident light is concentrated on the photoelectric conversion device PCD thereunder. The micro lenses ML may be arranged in a matrix form to constitute a micro lens array.

An anti-reflection layer 205 may be provided between the second surface 200b of the additional substrate 200 and the color filters CF. The anti-reflection layer 205 may prevent incident light from being reflected at the second surface 200b of the additional substrate 200. For example, the anti-reflection layer 205 may have a multi-layered structure in which material layers having different refractive indexes are alternately stacked. As the numbers of the material layers having different refractive indexes are increased, the transmittance of the anti-reflection layer 205 may be improved.

First to fourth upper insulating layers 210, 220, 230 and 240 may be stacked on the first surface 200a of the additional substrate 200. Interconnection lines IL and vias VI may be provided in the first to fourth upper insulating layers 210, 220, 230 and 240. The vias VI may vertically connect the interconnection lines IL. For example, the interconnection lines IL of the second sub-chip CH2 may be electrically connected to the readout circuit devices RCX.

The photoelectric conversion devices PCD of the second sub-chip CH2 may generate photocharges in response to light incident through the second surface 200*b* of the additional substrate 200. In other words, the image sensor chip 12 according to the present embodiments may be a backside illuminated image sensor (BIS).

The insertion layer 300 between the first and second sub-chips CH1 and CH2 may include a connecting portion 310. The connecting portion 310 may electrically connect the interconnection lines IL of the first sub-chip CH1 to the interconnection lines IL of the second sub-chip CH2. The connecting portion 310 may include a metal, e.g., copper and/or tungsten.

More particularly, the connecting portion 310 may include a first conductive pattern 310*a* electrically connected to at least one of the interconnection lines IL of the first sub-chip CH1, and a second conductive pattern 310*b* electrically connected to at least one of the interconnection lines IL of the second sub-chip CH2. The first and second conductive patterns 310*a* and 310*b* may be in direct contact with each other and may be electrically connected to each other.

The insertion layer 300 may further include a first insulating layer 350*a* and a second insulating layer 350*b*. The first and second conductive patterns 310*a* and 310*b* may be provided in the first and second insulating layers 350*a* and 350*b*, respectively. For example, each of the first and second insulating layers 350*a* and 350*b* may include a silicon oxide layer.

The insertion layer 300 may further include a first metal diffusion barrier layer 360*a*, a second metal diffusion barrier layer 360*b*, and a third metal diffusion barrier layer 360*c*. The first metal diffusion barrier layer 360*a* may be disposed between the first sub-chip CH1 and the first insulating layer 350*a*, the second metal diffusion barrier layer 360*b* may be disposed between the first insulating layer 350*a* and the second insulating layer 350*b*, and the third metal diffusion barrier layer 360*c* may be disposed between the second insulating layer 350*b* and the second sub-chip CH2. The first to third metal diffusion barrier layers 360*a*, 360*b* and 360*c* may include SiN, SiCN, SiOCN, SiON or SiC. The first to third metal diffusion barrier layers 360*a*, 360*b* and 360*c* may inhibit or prevent a metal from being diffused from the connecting portion 310.

FIG. 17 is a view illustrating a semiconductor product having a peri-on-cell (POC) structure.

Referring to FIG. 17, a semiconductor product 13 may include a peripheral circuit structure PS and a cell structure CS, and the peripheral circuit structure PS may be stacked on the cell structure CS. In other words, the cell structure CS may overlap with the peripheral circuit structure PS when viewed in a plan view.

The cell structure CS may include a cell array including a plurality of memory cells. For example, the memory cell may include the semiconductor memory cell 11 of FIG. 15, i.e., the DRAM cell. In another example, the memory cell may include a NAND cell or a static random-access memory (SRAM) cell.

The peripheral circuit structure PS may include row and column decoders, a page buffer, and a control circuit, which are configured to control the cell array. Circuits of the peripheral circuit structure PS may include the semiconductor devices 10 according to embodiments.

By way of summation and review, embodiments provide a semiconductor device including a channel layer which has a high mobility and is capable of being deposited. That is, in the semiconductor device according to embodiments, the width of the channel layer may be less than that of the gate electrode, e.g., via formation of source and drain electrodes in a region formed by removal of portions of the channel layer, and thus the resistance in the channel layer may be reduced to improve the drive current. Further, the channel layer and the gate oxide layer of the semiconductor device according to embodiments may be formed using etching and deposition processes, and thus the semiconductor device may be manufactured by low-temperature processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a gate electrode on the substrate;
a channel layer between the substrate and the gate electrode, the channel layer including an amorphous oxide semiconductor, and a width of the gate electrode being greater than a width of the channel layer;
a first conductive electrode on the substrate, including a source region contacting a first side surface of the channel layer and a first conductive via extending from the source region; and
a second conductive electrode on the substrate, including a drain region contacting a second side surface of the channel layer and a second conductive via extending from the drain region,
wherein the source region and the first conductive via are of a single body, and
wherein the drain region and the second conductive via are of a single body.

2. The semiconductor device as claimed in claim 1, wherein:
a width of the source region is greater than a width of the first conductive via, and
a width of the drain region is greater than a width of the second conductive via.

3. The semiconductor device as claimed in claim 1, wherein the channel layer has a cross section having a rectangular shape.

4. The semiconductor device as claimed in claim 1, wherein:
the first side surface of the channel layer is vertically aligned with a first side surface of the gate electrode, and
the second side surface of the channel layer is spaced apart from a second side surface of the gate electrode toward the first side surface of the gate electrode, the second side surface of the gate electrode being opposite the first side surface of the gate electrode.

5. The semiconductor device as claimed in claim 1, wherein at least one of the first side surface of the channel layer and the second side surface of the channel layer overlaps with the gate electrode when viewed in plan view.

6. The semiconductor device as claimed in claim 5, wherein the gate electrode extends beyond the channel layer along a direction parallel to a top surface of the substrate.

7. The semiconductor device as claimed in claim 1, wherein the channel layer is a deposition product, the deposition product being formed by a deposition process performed at a temperature of 50 degrees Celsius to 400 degrees Celsius.

8. The semiconductor device as claimed in claim 1, wherein the channel layer includes at least one of indium gallium zinc oxide and indium tin zinc oxide.

9. The semiconductor device as claimed in claim 1, wherein each of the first conductive electrode and the second conductive electrode includes at least one of titanium, tantalum, tungsten, copper, and aluminum.

10. The semiconductor device as claimed in claim 1, wherein the substrate is a semiconductor substrate, a glass substrate, or a plastic substrate.

11. A semiconductor device, comprising:
   a substrate;
   a gate electrode on the substrate;
   a channel layer between the substrate and the gate electrode, the channel layer including an amorphous oxide semiconductor, and a width of the channel layer progressively decreasing from a bottom surface of the channel layer toward a top surface of the channel layer;
   a first conductive electrode on the substrate, including a source region contacting a first side surface of the channel layer and a first conductive via extending from the source region; and
   a second conductive electrode on the substrate, including a drain region contacting a second side surface of the channel layer and a second conductive via extending from the drain region,
   wherein the source region and the first conductive via are of a single body,
   wherein the drain region and the second conductive via are of a single body, and
   wherein at least one of the first conductive electrode and the second conductive electrode extends horizontally to a position under the gate electrode to vertically overlap with the gate electrode.

12. The semiconductor device as claimed in claim 11, wherein a maximum width of the channel layer is less than a width of the gate electrode.

13. The semiconductor device as claimed in claim 11, wherein a minimum width of the channel layer is less than a width of the gate electrode.

14. The semiconductor device as claimed in claim 11, wherein each of the first conductive electrode and the second conductive electrode includes at least one of titanium, tantalum, tungsten, copper, and aluminum.

15. The semiconductor device as claimed in claim 11, wherein the substrate is a semiconductor substrate, a glass substrate, or a plastic substrate.

16. A semiconductor device, comprising:
   a substrate;
   a first conductive electrode on the substrate, the first conductive electrode including a source region and a first conductive via;
   a second conductive electrode on the substrate, the second conductive electrode including a drain region and a second conductive via;
   a channel layer on the substrate, the channel layer being between the first conductive electrode and the second conductive electrode;
   a gate electrode on three different surfaces of the channel layer, a width of the channel layer being less than a width of the gate electrode;
   a gate oxide layer between the channel layer and the gate electrode, and between the substrate and the gate electrode; and
   an insulating layer on the substrate and covering the first conductive electrode, the second conductive electrode, the channel layer, and the gate electrode, the first conductive via and the second conductive via penetrating the insulating layer.

17. The semiconductor device as claimed in claim 16, wherein the channel layer includes an amorphous oxide semiconductor.

18. The semiconductor device as claimed in claim 16, wherein the width of the channel layer becomes progressively less from a bottom surface of the channel layer toward a top surface of the channel layer.

19. The semiconductor device as claimed in claim 16, wherein the channel layer has a cross section having a rectangular shape.

20. The semiconductor device as claimed in claim 16, further comprising a bit line in the insulating layer, the bit line being electrically connected to the first conductive electrode or the second conductive electrode.

\*    \*    \*    \*    \*